(12) United States Patent
Kwon et al.

(10) Patent No.: US 11,631,830 B2
(45) Date of Patent: Apr. 18, 2023

(54) FOLDABLE DISPLAY APPARATUS AND MANUFACTURING METHOD THEREOF

(71) Applicant: Samsung Display Co., Ltd., Yongin-si (KR)

(72) Inventors: Ohjune Kwon, Yongin-si (KR); Seungwook Kwon, Yongin-si (KR); Minsang Kim, Yongin-si (KR); Seungyong Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 17/166,334

(22) Filed: Feb. 3, 2021

(65) Prior Publication Data

US 2021/0159441 A1 May 27, 2021

Related U.S. Application Data

(60) Continuation of application No. 16/790,516, filed on Feb. 13, 2020, now Pat. No. 10,930,881, which is a
(Continued)

(30) Foreign Application Priority Data

Sep. 6, 2017 (KR) .......................... 10-2017-0113955

(51) Int. Cl.
*H01L 51/00* (2006.01)
*G06F 1/16* (2006.01)
(Continued)

(52) U.S. Cl.
CPC .......... *H01L 51/524* (2013.01); *G06F 1/1616* (2013.01); *G06F 1/1652* (2013.01);
(Continued)

(58) Field of Classification Search
CPC ...... G01F 1/1616; G06F 1/1652; G06F 9/301; G06F 1/1641; H05K 7/20963;
(Continued)

(56) References Cited

U.S. PATENT DOCUMENTS 6,037,103 A 3/2000 Hino
6,927,344 B1 8/2005 Gall et al.
(Continued)

FOREIGN PATENT DOCUMENTS

CN 1745487 3/2006
CN 101162703 4/2008
(Continued)

OTHER PUBLICATIONS

Non-Final Office Action dated Aug. 26, 2019, issued in U.S. Appl. No. 16/123,693.
(Continued)

*Primary Examiner* — Galina G Yushina
(74) *Attorney, Agent, or Firm* — H.C. Park & Associates, PLC

(57) ABSTRACT

A display apparatus including a display panel having a folding portion about which the display panel is configured to fold, a first lower film and a second lower film on one surface of the display panel, the first lower film and the second lower film being spaced apart from each other, at least one bump on the first lower film or the second lower film, and a first sub-layer on the first lower film, in which, when the display panel is folded, the folding portion is configured to fold so that a surface of the display panel located further from the first sub-layer is exposed and the first sub-layer faces another surface of the display panel located closer to the first sub-layer, and a height of the at least one bump is approximately less than or equal to a thickness of the first sub-layer.

10 Claims, 12 Drawing Sheets

Related U.S. Application Data division of application No. 16/123,693, filed on Sep. 6, 2018, now Pat. No. 10,600,991.

(51) Int. Cl.
| | |
|---|---|
| *H01L 27/12* | (2006.01) |
| *H01L 51/52* | (2006.01) |
| *H01L 27/32* | (2006.01) |
| *H01L 51/56* | (2006.01) |
| *H05K 7/20* | (2006.01) |
| *H01L 29/786* | (2006.01) |

(52) U.S. Cl.
CPC ...... *H01L 27/3244* (2013.01); *H01L 51/0097* (2013.01); *H01L 51/5253* (2013.01); *H01L 51/56* (2013.01); *H05K 7/20963* (2013.01); *H01L 27/1218* (2013.01); *H01L 27/3211* (2013.01); *H01L 29/7869* (2013.01); *H01L 51/529* (2013.01); *H01L 2251/5338* (2013.01)

(58) Field of Classification Search
CPC ........ Y02E 10/549; Y02P 70/50; H01L 51/54; H01L 27/3244; H01L 51/0097; H01L 51/5253; H01L 51/56; H01L 27/1218; H01L 27/3211; H01L 51/529; H01L 2251/5338

See application file for complete search history.

(56) References Cited

U.S. PATENT DOCUMENTS

| | | | |
|---|---|---|---|
| 7,482,207 B2 | 1/2009 | Brown et al. | |
| 7,968,453 B2 | 6/2011 | Tanaka et al. | |
| 8,174,027 B2 | 5/2012 | Kojima et al. | |
| 9,048,443 B2 | 6/2015 | Namkung et al. | |
| 9,065,054 B2 | 6/2015 | Voronov et al. | |
| 9,274,559 B2 | 3/2016 | Prushinskiy et al. | |
| 9,419,065 B2 | 8/2016 | Degner et al. | |
| 9,490,312 B2 | 11/2016 | Lee et al. | |
| 9,544,994 B2 | 1/2017 | Kwon et al. | |
| 9,688,051 B2 | 6/2017 | Min et al. | |
| 9,991,467 B2 | 6/2018 | Namkung et al. | |
| 10,043,999 B2 | 8/2018 | Senoo et al. | |
| 10,269,280 B2 | 4/2019 | Oh | |
| 2006/0188697 A1 | 8/2006 | Lee | |
| 2009/0278117 A1 | 11/2009 | Lim et al. | |
| 2014/0042406 A1* | 2/2014 | Degner | H01L 51/0097 438/34 |
| 2014/0240985 A1 | 8/2014 | Kim et al. | |
| 2015/0024170 A1 | 1/2015 | Min et al. | |
| 2016/0093644 A1* | 3/2016 | Ki | H01L 27/1222 257/43 |
| 2016/0093685 A1* | 3/2016 | Kwon | H01L 51/5253 257/40 |
| 2016/0204366 A1 | 7/2016 | Zhang et al. | |
| 2016/0295685 A1 | 10/2016 | Ryu et al. | |
| 2017/0001480 A1 | 1/2017 | Ferry et al. | |
| 2017/0062742 A1 | 3/2017 | Kim | |
| 2017/0263887 A1* | 9/2017 | Han | H01L 27/3244 |
| 2018/0019418 A1* | 1/2018 | Sonoda | H01L 51/5253 |
| 2018/0122830 A1 | 5/2018 | Kachatryan et al. | |
| 2019/0033493 A1 | 1/2019 | Kwon et al. | |
| 2019/0074478 A1 | 3/2019 | Kwon et al. | |
| 2019/0081256 A1 | 3/2019 | Kim et al. | |

FOREIGN PATENT DOCUMENTS

| | | |
|---|---|---|
| CN | 101840986 | 9/2010 |
| CN | 106023810 | 10/2016 |
| CN | 106129081 | 11/2016 |
| CN | 106328599 | 1/2017 |
| CN | 106450024 | 2/2017 |
| CN | 106717114 | 5/2017 |
| CN | 107104200 | 8/2017 |
| CN | 107112348 | 8/2017 |
| CN | 206400960 | 8/2017 |
| JP | H10-173318 | 6/1998 |
| JP | 2004-279966 | 10/2004 |
| KR | 10-2006-0001666 | 1/2006 |
| KR | 10-2006-0123597 | 12/2006 |
| KR | 10-2013-0076402 | 7/2013 |
| KR | 10-2015-0010036 | 1/2015 |
| KR | 10-2016-0117799 | 10/2016 |

OTHER PUBLICATIONS

Notice of Allowance dated Nov. 13, 2019, issued in U.S. Appl. No. 16/123,693.

Non-Final Office Action dated Jun. 29, 2020, issued in U.S. Appl. No. 16/790,516.

Notice of Allowance dated Oct. 21, 2020, issued in U.S. Appl. No. 16/790,516.

P. G. Carey et al., "Polysilicon thin film transistors fabricated at 100/spl deg/C on a flexible plastic substrate," 1997 55th Annual Device Research Conference Digest.

李双宏, OLED 器件铟封接关键技术研究 Key Technology Research of OLED Devices Indium Sealing, 电子科技大学, 2013 (with English Abstract).

Office Action dated Jul. 2, 2021, issued in Chinese Patent Application No. 201811031381.4. (with English Concise Exaplanation).

* cited by examiner

FOLDABLE DISPLAY APPARATUS AND MANUFACTURING METHOD THEREOF

CROSS-REFERENCE TO RELATED APPLICATIONS

This application is a Continuation of U.S. patent application Ser. No. 16/790,516, filed on Feb. 13, 2020, which is a Division of U.S. patent application Ser. No. 16/123,693, filed on Sep. 6, 2018, now issued as U.S. Pat. No. 10,600,991, which claims priority from and the benefit of Korean Patent Application No. 10-2017-0113955, filed on Sep. 6, 2017, each of which is hereby incorporated by reference for all purposes as if fully set forth herein.

BACKGROUND

Field

Exemplary embodiments of the invention relate generally to a foldable display apparatus in which a main body may be folded or unfolded, and, more particularly to an apparatus that facilitates folding with reduced interference from bumps formed during manufacture, as well as a manufacturing method thereof.

Discussion of the Background

Flat display apparatus such as an organic light-emitting display apparatus may be flexibly deformed, and thus may be manufactured to have a foldable structure for better portability.

Conventionally, manufacturing such a foldable flat display apparatus includes a step of removing a protective film on a folding portion to decrease the thickness thereof, to facilitate a folding operation. In the removing step, a protruding portion, which is so-called a bump, may be incidentally formed around a portion where the protective film is removed. The bump causes interference during folding, which may prevent or impede a folding operation.

The above information disclosed in this Background section is only for understanding of the background of the inventive concepts, and, therefore, it may contain information that does not constitute prior art.

SUMMARY

Exemplary embodiments provide improved foldable display apparatuses that facilitate folding with reduced interference from bumps, and manufacturing methods thereof.

Additional aspects will be set forth in the detailed description which follows, and, in part, will be apparent from the disclosure, or may be learned by practice of the inventive concepts.

According to one or more embodiments of the invention, a method of manufacturing a foldable display apparatus may include the steps of: disposing a protective film on one surface of a foldable display panel having a folding portion; removing at least a part of the protective film in the folding portion of the foldable display panel; and decreasing a height of at least one bump protruding from the protective film formed adjacent to the removed part of the protective film.

The step of decreasing a height of at least one bump may include abrading the at least one bump.

The step of removing at least a part of the protective film may include heating and melting away the part of the protective film corresponding to the folding portion.

The at least one bump may include two bumps respectively formed symmetrically at each side of the removed part of the protective film.

The step of decreasing a height of at least one bump may include decreasing a height of both of the two bumps formed symmetrically at respective sides of the removed part of the protective film, so that the two bumps have substantially the same height.

The bumps at the respective sides may protrude upwardly from a surface of the protective film.

The bumps at the respective sides may have no portion that protrudes above a surface of the protective film.

The two bumps may be formed asymmetrically to have different heights at each side.

The step of decreasing a height of at least one bump may include abrading only one of the two bumps.

The step of decreasing a height of at least one bump may include: forming one of the bumps to have a generally concave bump; and forming the other bump to have a generally convex bump, wherein the convex bump and the concave bump may have conforming shapes that may be nested together when the foldable display apparatus is a folded state.

The method may further include disposing a sub-layer on the protective film.

The step of decreasing a height of at least one bump may include decreasing the height of at least one bump such that a sum of heights of the two bumps at respective sides of the folded area when folded is less than or equal to twice a thickness of the sub-layer.

The sub-layer may include: a heat sink plate disposed on the protective film; and a cushion film disposed on the heat sink plate.

The folding portion may be configured to be folded such that the display panel faces outwardly and the protective film faces inwardly.

According to one or more embodiments of the invention, a foldable display apparatus may include: a foldable display panel having a folding portion about which display panel is configured to fold; a protective film on one surface of the display panel having two, spaced bumps disposed adjacent to and at opposite sides of the folding portion; and a sub-layer disposed on the protective film, wherein the folding portion is configured to fold so that the display panel faces exteriorly of the display panel and the sub-layer faces interiorly of the display panel, and wherein a sum of heights of the two bumps is approximately less than or equal to a sum of thicknesses of the two sub-layers at respective sides adjacent to the folding portion.

The two bumps may have substantially the same height and the height of each bump is approximately less than or equal to a thickness of the sub-layer.

The two bumps may have different heights and the height of at least one of the bumps may be approximately less than a thickness of the sub-layer.

The heights of each of the two bumps may be approximately less than or equal to a thickness of the protective film.

The two bumps may include a concave bump and a convex bump having conforming shapes configured to be nested together when the foldable display apparatus is in a folded state.

The total height of the concave bump and the convex bump in the nested, folded state may be approximately less than or equal to a sum of thicknesses of the two sub-layers at respective sides adjacent to the folding portion.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1A:
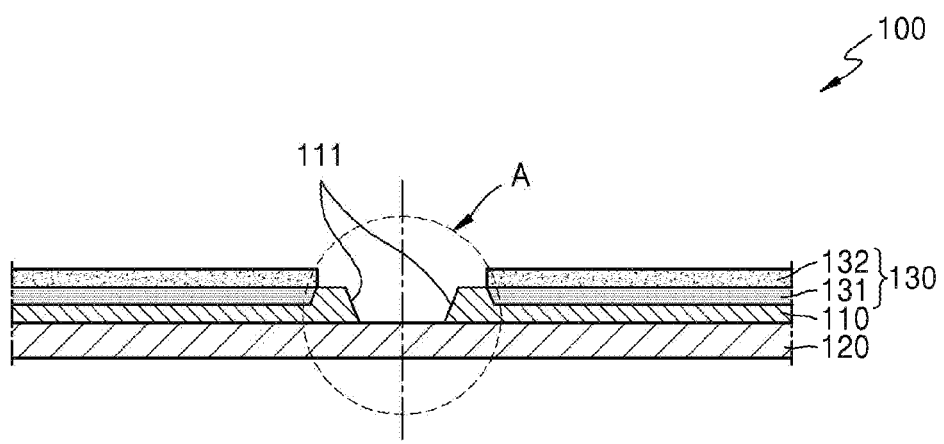
FIGS. 1A and 1B are cross-sectional views respectively illustrating an unfolded (or expanded) state and a folded (or compact) state of an embodiment of a foldable display apparatus constructed according to the principles of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
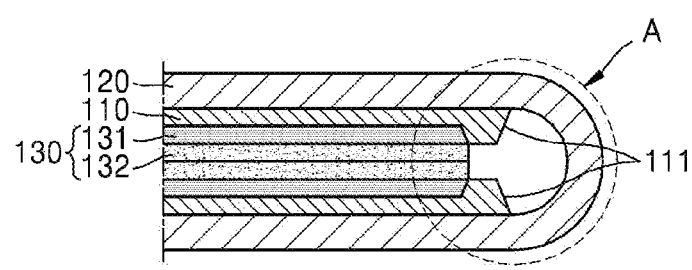

FIGS. 1A and 1B are cross-sectional views respectively illustrating an unfolded (or expanded) state and a folded (or compact) state of an embodiment of a foldable display apparatus 100 constructed according the principles of the invention.

The foldable display apparatus 100 may include a display panel 120 that is flexible and bendable, a protective film 110 attached on one surface of the display panel 120, and a sub-layer 130 including a heat sink plate 131 and a cushion film 132 provided over the protective film 110. The display panel 120 has a structure including a thin film transistor and a light-emitting device to produce an image, an encapsulation layer covering and protecting the thin film transistor and the light-emitting device, etc. stacked on and above a flexible substrate. Since the display panel 120 includes the flexible substrate instead of a hard glass substrate, the display panel 120 may be freely folded and unfolded within a permissible range according to its flexibility. Accordingly, in a compact state, the foldable display apparatus 100 may have improved portability after being folded as illustrated in FIG. 1B.

The foldable display apparatus 100 may be accommodated in an exterior case.

The foldable display apparatus 100 is folded such that the display panel 120 is located outside and the protective film 110 and the sub-layer 130 are located inside. In other words, a lower surface of the display panel 120 of FIG. 1A, which is configured to display an image to be viewed by a user, may be folded to be exposed to the outside in the compact state.

A folding portion A defines a portion where the foldable display apparatus 100 may be folded and unfolded, and the protective film 110 is removed in the folding portion A to facilitate a folding operation. In other words, by removing a portion of the protective film 110 corresponding to the folding portion A, the total thickness of the foldable display apparatus 100 in the folding portion A may be decreased so that the foldable display apparatus 100 may be smoothly folded and unfolded. Also, the folding portion A avoids becoming a starting point for exfoliation of the protective film 110 in response to repeated folding and unfolding motions.

Figure 2A:
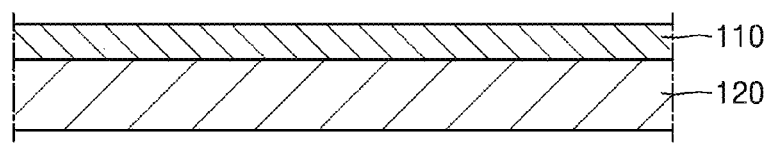
FIGS. 2A, 2B, 2C, 2D, and 2E are cross-sectional views sequentially illustrating an exemplary manufacturing process of the foldable display apparatus of FIGS. 1A and 1B, according to the principles of the invention.
Figure 2B:
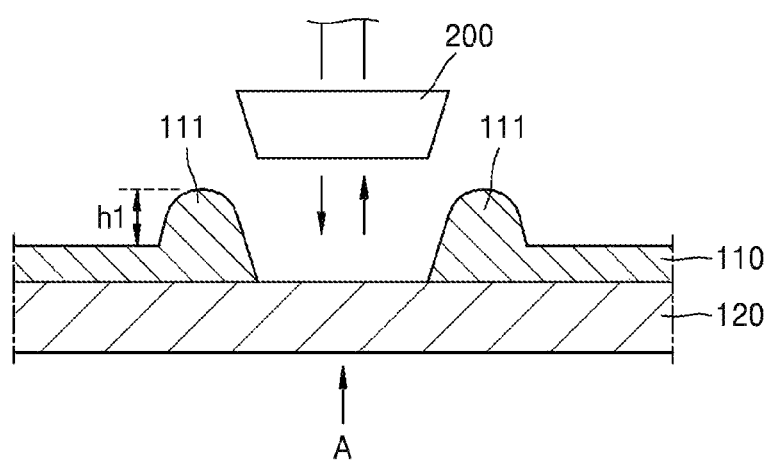

Referring to FIG. 2B, a protrusion or a bump 111 may be incidentally formed in a process of removing the protective film 110 in the folding portion A. In other words, the protective film 110 in the folding portion A is removed by contacting a heating element such as a heat block 200 with the protective film 110 in the expanded position to heat and melt away the protective film 110 in the folding portion A. In this state, part of the removed portion of the protective film 110 in the folding portion A is pushed up at both sides, forming the bump 111 protruding upward nearby.

The bump 111 may not cause any problem if the bump 111 does not cause any interference in the folded state as illustrated in FIG. 1B. However, when the protruding height of the bump 111 is greater than the thickness of the sub-layer 130, the foldable display apparatus 100 may not be properly folded because the bumps 111 at opposing sides may contact each other.

Figure 2C:
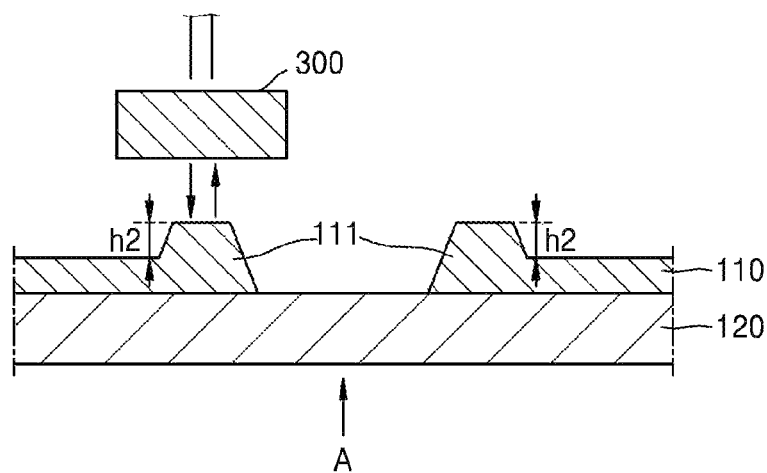

To address the above problem, in the exemplary embodiments, as illustrated in FIG. 2C, using a abrader 300, which may be a grinder or other device that removes material from the bump 111 by grinding, eroding or other mechanical type process that reduces the first height h1 of the bump to a second height h2, which is less than or equal to a thickness h3 of the sub-layer 130. According to this exemplary embodiment, the bump 111 may have reduced interference during folding and unfolding of the foldable display apparatus 100, and thus the foldable display apparatus 100 may have an improved and more stable folding operation.

Figure 6A:
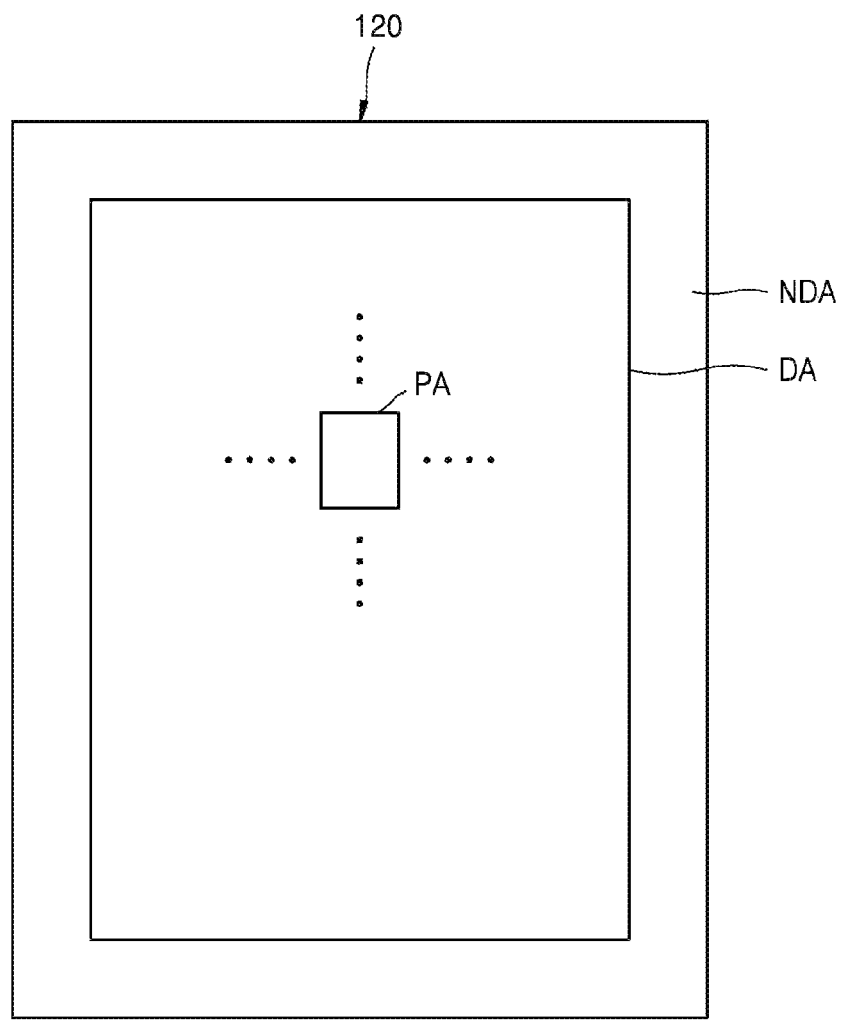
FIG. 6A is a plan view of the display panel illustrated in FIG. 1A.
Figure 6B:
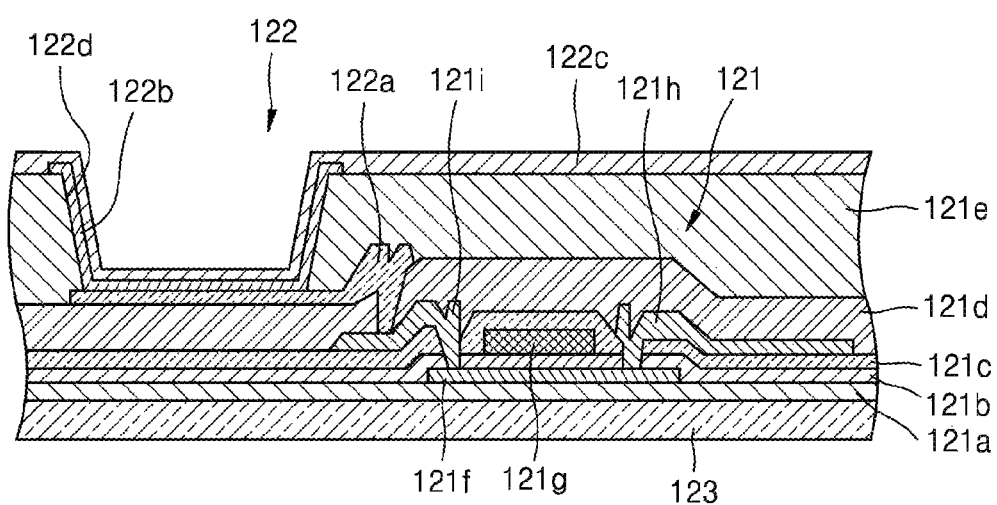
FIG. 6B is a cross-sectional view illustrating an internal structure of the display panel of FIG. 6A.

FIG. 6A is a plan view of the display panel illustrated in FIG. 1A, and FIG. 6B is a cross-sectional view illustrating an internal structure of the display panel of FIG. 6A. A detailed manufacturing process of the foldable display apparatus 100 including the abrading of the bump 111 is described later. Prior to the description of the manufacturing process of the foldable display apparatus 100, an internal structure of the display panel 120 is briefly described below with reference to FIGS. 6A and 6B.

FIG. 6A schematically illustrates a planar structure of the display panel 120, which includes a display area DA displaying an image and a non-display area NDA adjacent to the display area DA. The display area DA includes a plurality of pixel areas PA, and a pixel emitting a light is formed in each of the pixel areas PA. An image is formed by the lights emitted from a plurality of pixels provided in the display area DA.

The non-display area NDA may be arranged to surround the display area DA, and may include a driving unit such as a scan driving unit and a data driving unit to transmit signals to the pixels provided in the display area DA.

FIG. 6A illustrates a case in which the non-display area NDA surrounds the display area DA. However, the exemplary embodiments are not limited thereto. Accordingly, for example, the non-display area NDA may be arranged at only one side of the display area DA to reduce an area of the non-display area NDA where an image is not displayed, that is, a dead area.

Referring to FIG. 6B, one of the pixel areas PA of the display area DA includes a thin film transistor 121 and an organic light-emitting device 122. First, according to the structure of the thin film transistor 121, a buffer layer 121a is disposed on a flexible substrate 123 disposed of a polyimide material, an active layer 121f is disposed over the buffer layer 121a, and the active layer 121f includes source and drain regions in which N-type or P-type impurities are doped at a high concentration. The active layer 121f may be disposed of oxide semiconductor. For example, the oxide semiconductor may include oxide of a material selected from Group 12, Group 13, and Group 14 metal elements such as Zn, In, Ga, Sn, Cd, Ge, or Hf, and a combination thereof. For example, a semiconductor active layer 212 may include G-I—Z—O[$(In_2O_3)a(Ga_2O_3)b(ZnO)c$], where "a", "b", and "c" are real numbers respectively satisfying conditions that a≥0, b≥0, and c>0. A gate electrode 121g is disposed over the active layer 121f with a gate insulating film 121b interposed therebetween. A source electrode 121h and a drain electrode 121i are disposed over the gate electrode 121g. An interlayer insulating film 121c is disposed between the gate electrode 121g, the source electrode 121h, and the drain electrode 121i. A passivation film 121d is disposed between the source electrode 121h, the drain electrode 121i, and an anode electrode 122a of the organic light-emitting device 122.

An insulating planarization film 121e, such as acryl, is disposed over the anode electrode 122a. After an opening 122d is disposed in the insulating planarization film 121e, the organic light-emitting device 122 is disposed.

The organic light-emitting device 122 emits light of red, green, and blue colors according to the flow of current to display image information. The organic light-emitting device 122 may include the anode electrode 122a connected to the drain electrode 121i of the thin film transistor 121 to receive a positive voltage therefrom, a cathode electrode 122c covering the entire pixel to receive a negative voltage, and an emission layer 122b disposed between the anode electrode 122a and the cathode electrode 122c to emit light.

A hole injection layer (HIL), a hole transport layer (HTL), an electron transport layer (ETL), an electron injection layer (EIL), etc. may be stacked adjacent to the emission layer 122b.

For example, the emission layer 122b may be separately formed for each pixel so that pixels emitting the light of red, green, and blue colors constitute a unit pixel. The emission layer 122b may be commonly formed across the entire pixel area regardless of the location of a pixel. The emission layer 122b may be formed by vertically stacking or mixing layers including an emission material emitting the light of, for example, red, green, and blue colors. Colors of each pixel may be combined to emit light having multiple colors including a white light. Furthermore, a color change layer or a color filter that converts the emitted white light to a specific color may be further provided.

A thin film encapsulation layer including an organic film and an inorganic film alternately stacked may be disposed over the cathode electrode 122c.

According to the exemplary embodiments, the display panel 120, which is flexible and foldable according to folding and unfolding operations, may be used in the foldable display apparatus 100.

FIGS. 2A, 2B, 2C, 2D, and 2E are cross-sectional views sequentially illustrating an exemplary manufacturing process of the foldable display apparatus of FIGS. 1A and 1B, according to the principles of the invention.

First, as illustrated in FIG. 2A, the protective film 110 is disposed on one surface of the display panel 120. The protective film 110 may be formed of a polyethylene terephthalate resin (PET) material.

Next, as illustrated in FIG. 2B, the heating element 200 is moved to contact the protective film 110 in the folding portion A, thereby melting and removing a contacting portion of the protective film 110 that contacts the heating element 200. In this state, part of the contacting portion is pushed aside toward opposing boundaries of the folding portion A, incidentally forming a protrusion, that is, the bump 111.

Figure 2D:
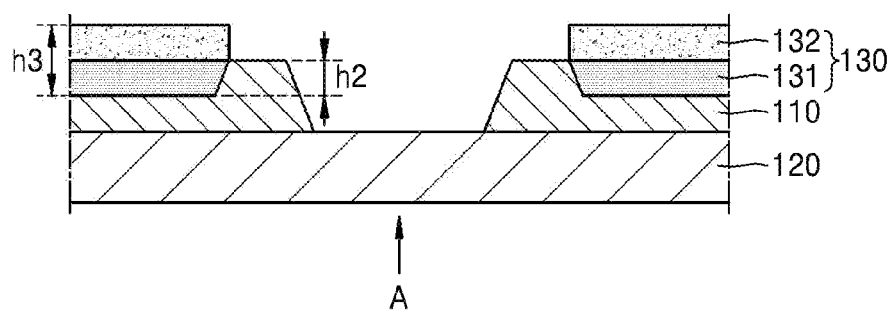

When the bumps 111 at the opposing sides are left untreated, during a folding operation later, the bumps 111 at the opposing sides may contact each other, preventing or impeding the folding operation, and thus the foldable display apparatus 100 may not be properly, completely, and/or easily folded. Accordingly, as illustrated in FIG. 2C, the bumps 111 at the opposing sides are abraded using the abrader 300, thereby decreasing the height of the bumps 111. In other words, the bump 111 having a first height h1 is reduced to a second height h2, which is less than the first height h1. The second height h2 of the bumps 111 after abrading is less than or equal to a thickness h3 of the sub-layer 130 that is subsequently stacked on the protective film 110, as illustrated in FIG. 2D.

Figure 2E:
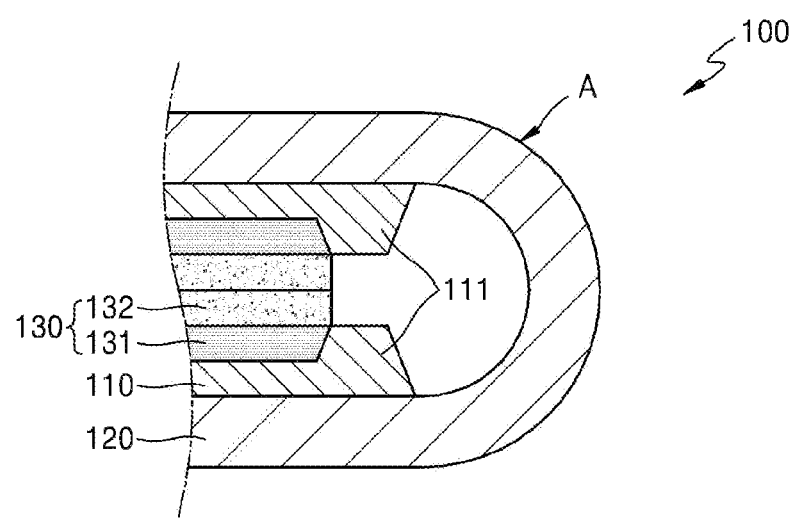

Referring to FIG. 2E, an upper surface of the bump 111 is abraded to be flat so that the height of the bump 111 is decreased to the second height h2, which is less than or equal to the thickness h3 of the sub-layer 130. Accordingly, no obstacle to folding is formed in the space or interval between the sub-layers 130 facing each other from the bumps 111 that interferes with the opposing sides contacting each other during the folding of the foldable display apparatus 100. Thus, when the sub-layers 130 at the both sides of the folding portion A contact each other, a improved and/or stable folded state may be maintained.

According to the exemplary embodiments, the bump 111 formed by removing the protective film 110 may be abraded to remove or reduce the bump from impeding folding the foldable display apparatus 100, and the folding operation of the foldable display apparatus 100 may be improved and/or stabilized, and thus improving the quality and reliability of the foldable display apparatus.

According to the exemplary embodiment illustrated in FIGS. 2A, 2B, 2C, 2D, and 2E, the bumps 111 at both sides of the folding portion A are abraded to have substantially the same second height h2 while maintaining a protruding shape. However, the exemplary embodiments are not limited thereto.

FIGS. 3A, 3B, 3C, and 3D are cross-sectional views sequentially illustrating another exemplary manufacturing process of a foldable display apparatus, according to the principles of the invention, in which only one of the bumps 111 is abraded.

Figure 3A:
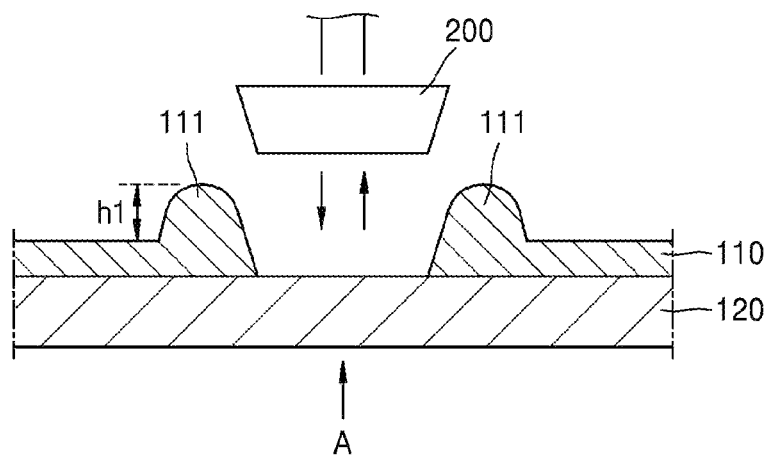
FIGS. 3A, 3B, 3C, and 3D are cross-sectional views sequentially illustrating another exemplary manufacturing process of a foldable display apparatus, according to the principles of the invention.

As illustrated in FIG. 3A, the manufacturing process of a foldable display apparatus according to the exemplary embodiment is substantially the same as that of the exemplary embodiment illustrated in FIGS. 2A and 2B until the steps of attaching the protective film 110 on the display panel 120 and removing the folding portion A.

Figure 3B:
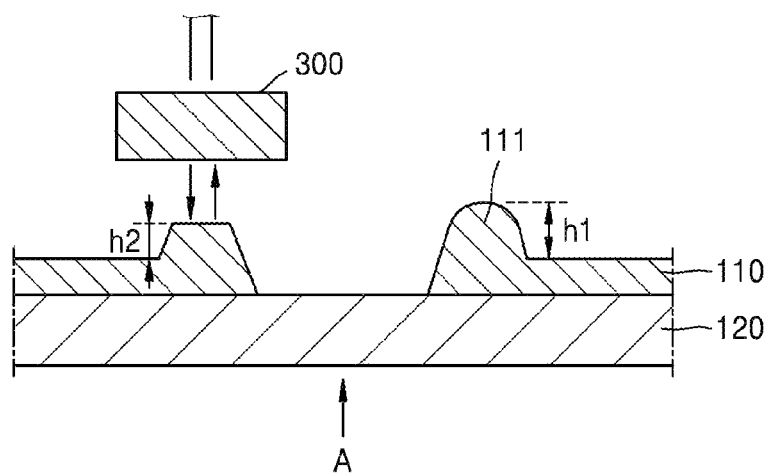
Figure 3C:
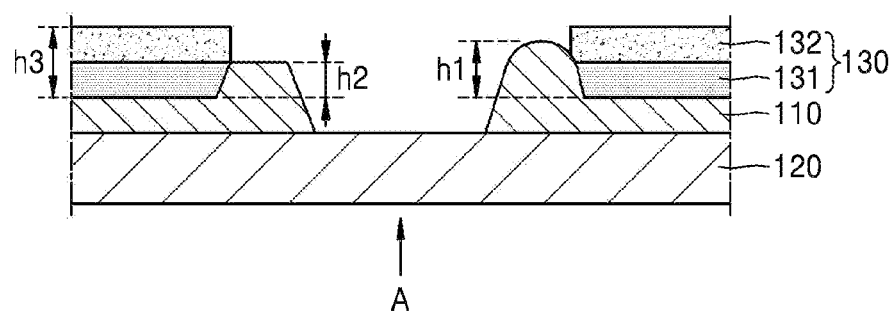
Figure 3D:
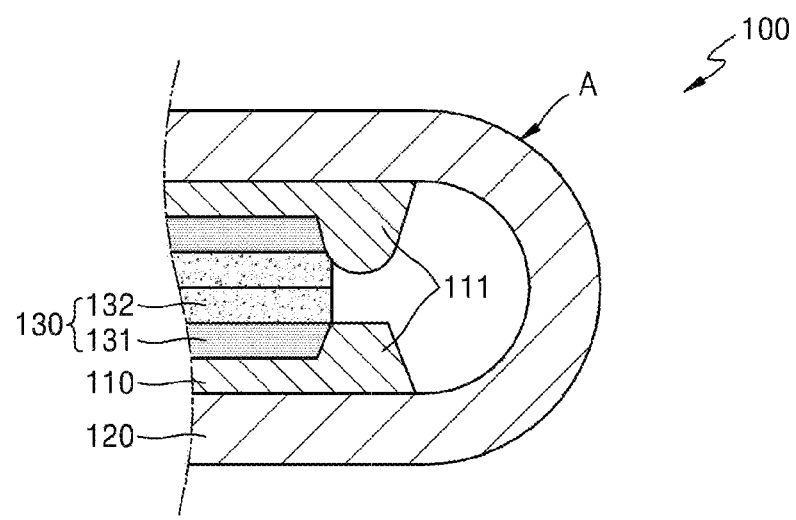

In this embodiment, however, not all of the bumps 111 at both sides of the folding portion A that are incidentally formed are abraded, but only the bump 111 at one side is abraded using the abrader 300 to have the second height h2, as illustrated in FIG. 3B. Next, as illustrated in FIG. 3C, the sub-layer 130 is stacked. Referring to FIG. 3D, even though the height of only one side is decreased, the formation of an obstacle in the space or interval between the folded sub-layers 130 that impedes or prevents proper folding of the foldable display apparatus 100 is avoided. Accordingly, the sum of the first height and the second height h1+h2 of the bumps 111 at both sides in the folded position is less than or equal to twice the thickness h3 of the sub-layer 130.

FIGS. 4A, 4B, 4C, and 4D are cross-sectional views sequentially illustrating yet another exemplary manufacturing process of a foldable display apparatus.

Figure 4A:
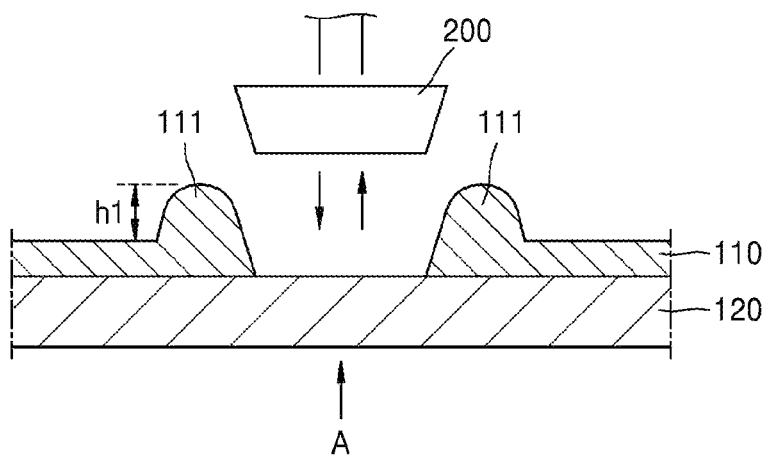
FIGS. 4A, 4B, 4C, and 4D are cross-sectional views sequentially illustrating yet another exemplary manufacturing process of a foldable display apparatus.
Figure 4B:
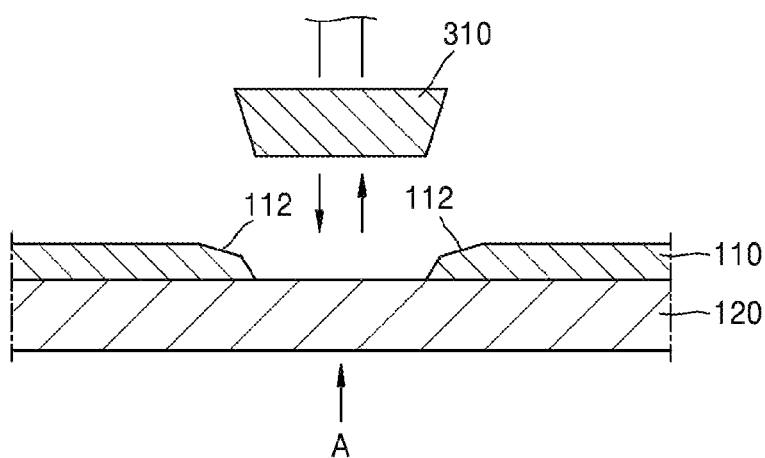

As illustrated in FIG. 4A, the manufacturing process of a foldable display apparatus according to the exemplary embodiment is substantially the same as that of the exemplary embodiment illustrated in FIGS. 2A and 2B until the steps of attaching the protective film 110 on the display panel 120 and removing the folding portion A. As illustrated in FIG. 4B, the bumps 111 at both sides of the folding portion A are abraded using a abrader 310. In this state, the bumps 111 at both sides are abraded to have a height lower than the thickness of the protective film 110. That is, the protective film 110 does not have any portion protruding upward from the surface of the protective film 110; rather, the surface of the protective film 110 is recessed inwardly, forming bumps with an inclined groove 112 having a generally concave shape.

Figure 4C:
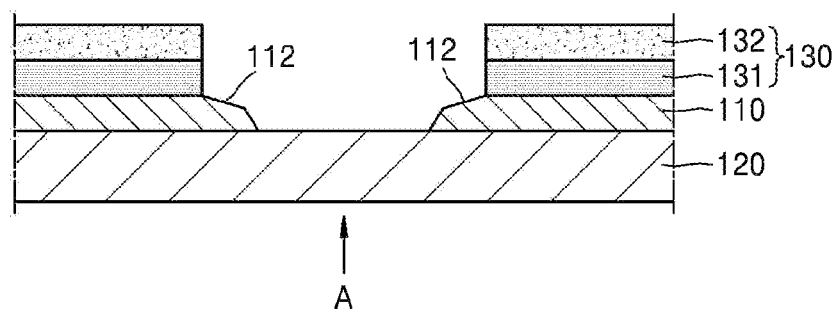
Figure 4D:
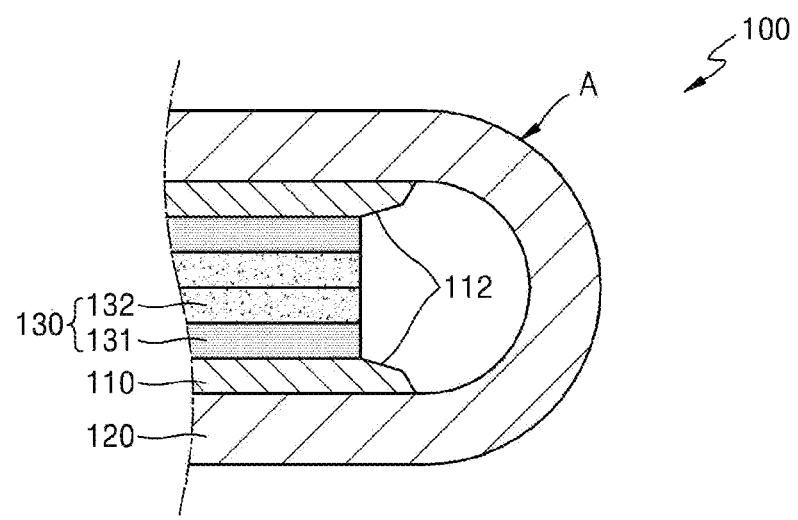

Accordingly, since the protective film 110 includes the inclined concave bump 112 and no portion of the protective film 110 is protruding upward from the surface of the protective film 110, no portion of the protective film 110 prevents or impedes the folding of the foldable display apparatus 100 when the sub-layers 130 are formed as illustrated in FIG. 4C and the foldable display apparatus 100 is folded as illustrated in FIG. 4D.

FIGS. 5A, 5B, 5C, and 5D are cross-sectional views sequentially illustrating another exemplary manufacturing process of a foldable display apparatus. According to FIGS. 5A, 5B, 5C, and 5D, bumps 111 at both sides are abraded to have a matching shape of concavity and convexity so that the bumps 111 may fit each other when folded.

Figure 5A:
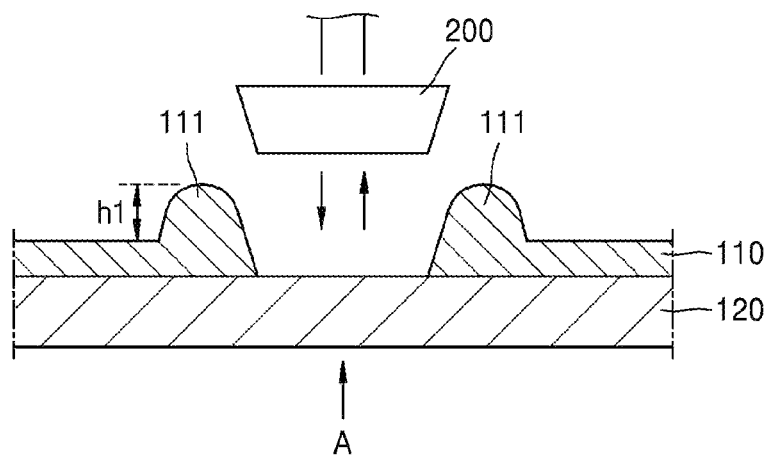
FIGS. 5A, 5B, 5C, and 5D are cross-sectional views sequentially illustrating another exemplary manufacturing process of a foldable display apparatus.
Figure 5B:
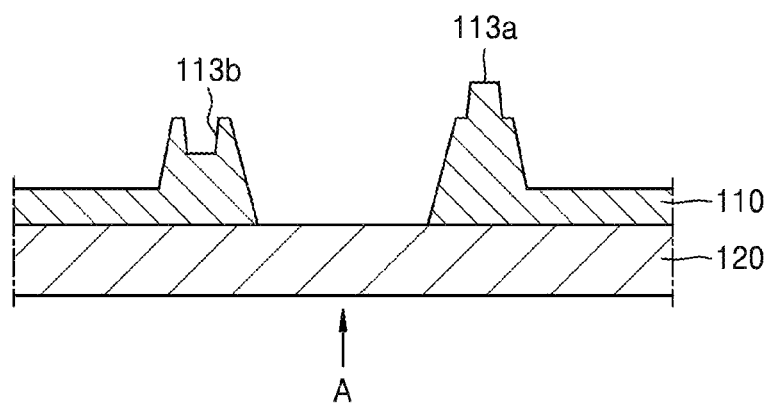
Figure 5C:
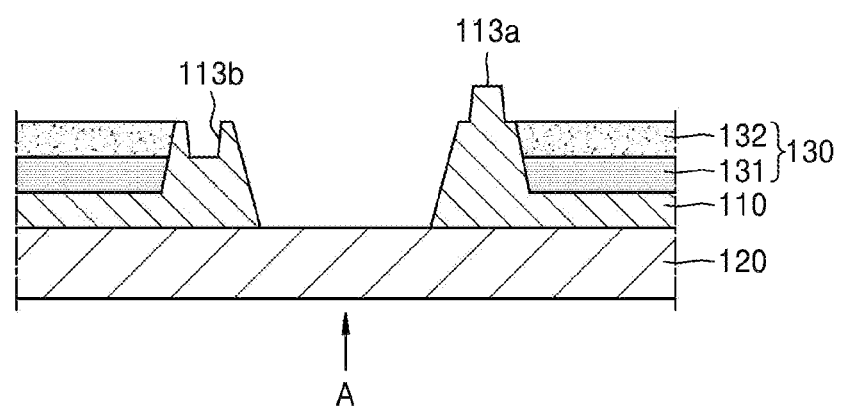
Figure 5D:
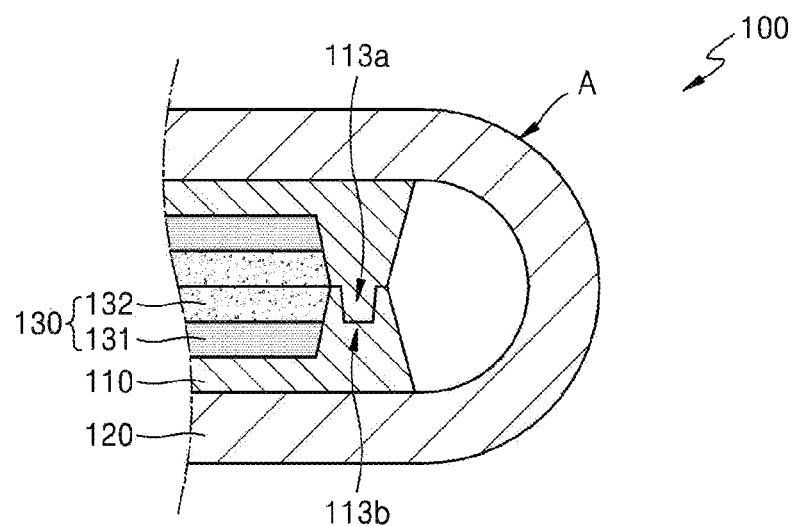

First, as illustrated in FIG. 5A, the manufacturing process of a foldable display apparatus according to the exemplary embodiment is substantially the same as that of the exemplary embodiment illustrated in FIGS. 2A and 2B until the steps of attaching the protective film 110 on the display panel 120 and removing the folding portion A. As illustrated in FIG. 5B, the bumps 111 at both sides of the folding portion A are abraded. In this state, the bumps 111 at both sides are abraded into a convexly shaped bump 113a at one side and a concavely bump 113b at the other side, such that bumps 113a may nest within bump 113b. Then, the sub-layers 130 are stacked as illustrated in FIG. 5C. Accordingly, when the foldable display apparatus 100 is folded as illustrated in FIG. 5D, the convex bump 113a and the concave bump 113b at opposing side of the folding area A have corresponding shapes that may be nested together. Thus the foldable display apparatus 100 have no obstacles that impede or prevent folding when the top surfaces of the convex bump 113a and the concave bump 113b contact each other. In a folded state, since the convex bump 113a and the concave bump 113b are firmly engaged with each other like a nested, sawtooth, the strength of the folding portion A may be further enforced and anti-shock properties may be improved.

Thus, according to the foldable display apparatus and the manufacturing method thereof as described above, impedance of folding due to the bump incidentally formed during removal of the protective film in the folding portion may be effectively prevented or reduced, and thus the foldable display apparatus may have an improved and/or stabilized folding operation.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display apparatus comprising:
a display panel having a folding portion about which the display panel is configured to fold;
a first lower film and a second lower film on one surface of the display panel, the first lower film and the second lower film being spaced apart from each other;
a first bump on the first lower film or the second lower film;
a first sub-layer on the first lower film; and
a second sub-layer on the second lower film,
wherein the first bump is integrally formed with the first lower film or the second lower film, and comprises a same material as the first lower film or the second lower film,
wherein, when the display panel is folded, the folding portion is configured to fold so that a surface of the display panel located further from the first sub-layer is exposed and the first sub-layer faces another surface of the display panel located closer to the first sub-layer, and
wherein a height of the first bump is approximately less than or equal to a thickness of the first sub-layer.

2. The display apparatus of claim 1,
wherein a height of the first bump is approximately less than or equal to a thickness of the second sub-layer.

3. The display apparatus of claim 2, wherein the first sub-layer and the second sub-layer are spaced apart from each other.

4. The display apparatus of claim 2, wherein the first sub-layer and the second sub-layer have substantially a same thickness.

5. A display apparatus comprising:
a display panel having a folding portion about which the display panel is configured to fold;
a first lower film and a second lower film on one surface of the display panel, the first lower film and the second lower film being spaced apart from each other;
a first bump on the first lower film;
a second bump on the second lower film;
a first sub-layer on the first lower film; and
a second sub-layer on the second lower film, wherein the first bump is integrally formed with the first lower film or the second lower film, and comprises a same material as the first lower film or the second lower film, wherein, when the display panel is folded, the folding portion is configured to fold so that a surface of the display panel located further from the first sub-layer is exposed and the first sub-layer faces another surface of the display panel located closer to the first sub-layer, and wherein a height of the first bump is approximately less than or equal to a thickness of the first sub-layer.

6. The display apparatus of claim 5, wherein the first bump and the second bump are spaced apart from each other and disposed at opposite sides of the folding portion.

7. The display apparatus of claim 5, wherein the first bump and the second bump have substantially a same height.

8. The display apparatus of claim 5, wherein the first bump and the second bump have substantially different heights.

9. The display apparatus of claim 5, wherein a sum of heights of the first bump and the second bump is approximately less than or equal to a sum of thicknesses of the first sub-layer and the second sub-layer.

10. A display apparatus comprising:

a display panel having a folding portion about which the display panel is configured to fold;

a first lower film and a second lower film on one surface of the display panel, the first lower film and the second lower film being spaced apart from each other, at least one of the first lower film and the second lower film including a first portion and a second portion having a greater thickness than the first portion; and a first sub-layer on the first lower film;

wherein, when the display panel is folded, the folding portion is configured to fold so that a surface of the display panel located further from the first sub-layer is exposed and the first sub-layer faces another surface of the display panel located closer to the first sub-layer, wherein the second portion is exposed from the first sub-layer, and wherein a height difference between the first portion and the second portion of the at least one of the first lower film and the second lower film is approximately less than or equal to a thickness of the first sub-layer.

\* \* \* \* \*